US005535494A

United States Patent [19]

Plesinger et al.

[11] Patent Number: 5,535,494

[45] Date of Patent: Jul. 16, 1996

[54] METHOD OF FABRICATING A PIEZOELECTRIC INK JET PRINTHEAD ASSEMBLY

[75] Inventors: Boris Plesinger, Scottsdale, Ariz.; Brad D. Suma, Cypress, Tex.

[73] Assignee: Compaq Computer Corporation, Houston, Tex.

[21] Appl. No.: 311,420

[22] Filed: Sep. 23, 1994

[51] Int. Cl.[6] .................. H01L 41/22

[52] U.S. Cl. .................. 29/25.35; 29/890.1; 346/140.1; 347/71

[58] Field of Search .................. 29/25.35, 890.1; 346/140.1; 347/68–72

[56] References Cited

U.S. PATENT DOCUMENTS

| | | | |
|---|---|---|---|
| 5,193,256 | 3/1993 | Ochiai | 29/890.1 X |
| 5,479,685 | 1/1996 | Shimokata et al. | 29/25.35 |

*Primary Examiner*—Carl E. Hall
*Attorney, Agent, or Firm*—Konneker & Smith

[57] ABSTRACT

A piezoelectric ink jet printhead is formed from two rectangular blocks of PZT material each having interdigitated series of grooves and ribs formed on one side thereof. The blocks are relatively positioned to precisely align the outer sides of their rib portions in a facing relationship to form a printhead body having therein a spaced series of ink receiving channels defined by the facing groove portions of the two blocks and laterally bounded by internal sidewalls defined by the aligned rib portions of the blocks. The channels open outwardly through front and rear end portions of the body. An orifice plate is operatively secured over the front ends of the channels, and the rear ends of the channels are appropriately sealed. To transmit piezoelectric driving signals to the internal sidewalls a cable is provided with spaced, longitudinally extending series of metal traces formed on the opposite sides of its dielectric body, with cutout areas being formed in a front end portion of the cable between its traces to form finger portions on the front end of the cable. The finger portions of the cable are positioned between the facing sides of the ribs within the printhead body, in precise alignment therewith, and are conductively secured thereto. The metal coated opposite sides of each cable finger are electrically coupled to one another by a metal material extending through a longitudinally spaced series of openings formed in the finger.

8 Claims, 4 Drawing Sheets

METHOD OF FABRICATING A PIEZOELECTRIC INK JET PRINTHEAD ASSEMBLY

BACKGROUND OF THE INVENTION

1. Field of the Invention

The present invention relates generally to ink jet printing apparatus, and more particularly relates to the fabrication of piezoelectrically operable ink jet printhead assemblies.

2. Description of Related Art

A piezoelectrically actuated ink jet printhead is a device used to selectively eject tiny ink droplets onto a print medium sheet operatively fed through a printer, in which the printhead is incorporated, to thereby form from the ejected ink droplets selected text and/or graphics on the sheet. In one representative configuration thereof, an ink jet printhead has, within its body portion an internal array of horizontally spaced, mutually parallel ink receiving channels. These internal channels are covered at their front ends by a plate member through which a spaced series of small ink discharge orifices are formed. Each channel opens outwardly through a different one of the spaced orifices.

A spaced series of internal piezoelectric wall portions of the printhead body (typically formed from a piezoceramic material referred to as "PZT") separate and laterally bound the channels along their lengths. To eject an ink droplet through a selected one of the discharge orifices, the two printhead sidewall portions that laterally bound the channel associated with the selected orifice are piezoelectrically deflected into the channel and then returned to their normal undeflected positions. The driven inward deflection of the opposite channel wall portions increases the pressure of the ink within the channel sufficiently to force a small quantity of ink, in droplet form, outwardly through the discharge orifice.

A conventional method of fabricating an ink jet printhead of this type has been to provide top and bottom rectangular blocks of appropriately polled PZT material respectively having bottom and top side surfaces and front and rear ends, with the bottom PZT block having a longer front-to-rear length than the top PZT block. A recessed ink supply header is appropriately formed in the bottom side surface of the top PZT block adjacent its rear end.

To provide for the proper transmission of electrical driving signals to the interior of the finished printhead body, the bottom and top side surfaces of the top and bottom PZT blocks, respectively must be laboriously metallized before forming the interior body channels and attaching the front end orifice plate. Typically, the metallizing coating applied to these printhead body surfaces comprises a layer of a Ni/Cr coating to the outer side surface of which a layer of gold is applied to provide satisfactory electrical conductivity characteristics to the finished metallization coating.

After the metallization coating is applied to these surfaces of the top and bottom PZT body blocks, spaced series of grooves that extend between the front and rear ends of the blocks are cut (using a precision dicing saw) through the metallization coatings and into the underlying PZT material, with rear end portions of the grooves in the top PZT block communicating with its ink supply header. Using an appropriate electrically conductive adhesive material, the metallized coatings are then bonded together, with the front ends of the top and bottom blocks, and their side surface grooves, being precisely aligned with one another.

In this partially assembled state of the printhead body, the aligned grooves form the interior ink receiving channels within the printhead body, and a rear end portion of the bottom PZT block and its grooves extend rearwardly beyond the rear end of the top PZT block. Both the front ends and the rear ends of the channels are open at this point in the fabrication process.

To complete the fabrication of the printhead the orifice plate is operatively positioned on and secured to the front end of the body and the rear end of the ink receiving channels are appropriately sealed off. Additionally, an ink supply tube is suitably communicated with the interior ink supply header. On the exposed rear top side portion of the bottom PZT block, the grooves formed therein form a spaced series of exposed, ribs in the bottom block with the top sides of these ribs being covered with remaining strips of the metallization coating originally applied to the top side surface of the bottom PZT block.

These top side metal strips are used as electrically conductive traces through which piezoelectric driving signals may be transmitted to the spaced series of channel side walls defined within the interior of the printhead body by the metallized, bonded together groove ribs therein. These sidewall deflecting driving signals are transmitted to the interior of the printhead body via the electrically conductive surface traces on a flexible ribbon cable connected at one end to the exposed metallized surface strips on the lower PZT block, and at the other end to an appropriate electronic driver device external to the printhead.

This conventional piezoelectric ink jet printhead fabrication technique has two primary disadvantages. First, as is well known, the metallization of the opposing PZT body portion surfaces is a tedious, time-consuming, relatively expensive task that must be very carefully performed to achieve satisfactory printhead performance. Additionally, the relatively thin ribs extending along the exposed rear end portion of the bottom PZT block are susceptible to breakage, thereby potentially leading to disruption of the critical piezoelectrical driving circuitry.

It can be seen from the foregoing that it would be desirable to provide improved piezoelectric ink jet printhead apparatus, and associated fabrication methods, that eliminate or at least substantially reduce one or more of the foregoing problems, limitations and disadvantages associated with ink jet printheads conventionally constructed as generally described above. It is accordingly an object of the present invention to provide such improved ink jet printhead apparatus and associated fabrication methods.

SUMMARY OF THE INVENTION

In carrying out principles of the present invention, in accordance with a preferred embodiment thereof, a piezoelectric ink jet printhead assembly is provided and comprises first and second printhead body portions with opposing sides in which spaced series of grooves are formed to define aligned ribs in the opposing sides, the aligned ribs being piezoelectrically deflectable.

The printhead assembly also includes a generally flat driving signal control cable having a dielectric body portion with a first end portion extending outwardly from the first and second printhead body portions, and a second end portion having laterally separated, longitudinally extending finger portions interposed between and themselves being aligned with the aligned rib portions of the printhead body portions. The dielectric body portion of the cable has spaced series of longitudinally extending, electrically conductive first and second traces respectively formed on opposite first and second sides thereof, and extending along the finger portions, through which piezoelectric driving signals may be electrically transmitted.

First means are provided for conductively coupling the pair of first and second traces on each of the control cable finger portions, and second means are provided for conductively coupling the pair of first and second traces on each of the control cable finger portions to the aligned printhead body portion ribs between which the control cable finger portion extends.

The intersecured first and second printhead body portions preferably have aligned front and rear end surfaces between which their ribs longitudinally extend, with the joined opposing rib pairs defining therebetween a spaced series of piezoelectrically deflectable interior sidewalls interdigitated with ink receiving channels disposed within the printhead body and opening outwardly through its front end. An. orifice plate secured to the front end of the printhead body covers the front ends of the channels and has ink discharge orifices aligned and communicated with the channels. The open rear ends of the channels are appropriately sealed off, and means are provided for flowing ink into the interior body channels.

An electronic driving chip is coupled to the outwardly projecting second cable end portion and is operative to transmit piezoelectric driving signals to the cable finger portions through one of the series of first and second electrically conductive traces. When it is desired to eject ink from one of the interior channels, driving signals are transmitted to the cable finger portions incorporated in the interior sidewalls that laterally bound the channel. The receipt of these signals piezoelectrically deflects the sidewalls in inward directions into the channel, raising the pressure of the ink therein to an extent sufficient to eject ink outwardly through its associated orifice.

In one embodiment of the printhead assembly the first and second cable traces are formed from a metal material, representatively copper, the first means include portions of the metal material extending through the cable finger portions and conductively coupling the opposed pairs of first and second traces, and the second means include layers of electrically conductive adhesive material joining the finger trace portions to the outer rib side surfaces which they face. The use of the cable fingers with the conductively coupled first and second trace portions on their opposite sides eliminates the need to metallize the facing side surfaces of the first and second printhead body portions. Additionally, since the front and rear end portions of the printhead body portions are aligned with one another, there are no exposed ribs that are subject to breakage and corresponding disruption of the electrical printhead circuitry.

In a second embodiment of the printhead assembly, holes are formed through the cable fingers, transversely between the outer side surfaces of their opposite first and second traces, the outer side edge surfaces of the ribs are metallized, and the first and second means comprise a solder material disposed between the finger trace portions and the metallized rib surfaces and extending through the finger openings. While in this embodiment of the printhead it is necessary to metallize facing side surfaces of the opposed printhead body portions, there are no exposed rib portions subject to damage.

In a third embodiment of the printhead assembly the cable fingers are not formed before attachment of the first cable end portion to the printhead body. Instead, the first cable end portion is bonded between an ungrooved lower printhead body portion and an ungrooved intermediate printhead body portion. Grooves are then formed inwardly through the intermediate printhead body portion and extended between the opposed first and second trace pairs on the first cable end portion and into the underlying lower printhead body portion to simultaneously form the cable fingers, the interior printhead body sidewalls, and the ink receiving channels.

An ungrooved top printhead body portion is then attached to the outer side of the intermediate body portion to cover the open upper sides of the channels, an orifice plate is secured to the front end of the printhead body over the open front ends of the channels, and the open rear ends of the channels are appropriately sealed off.

DETAILED DESCRIPTION

Figure 1:
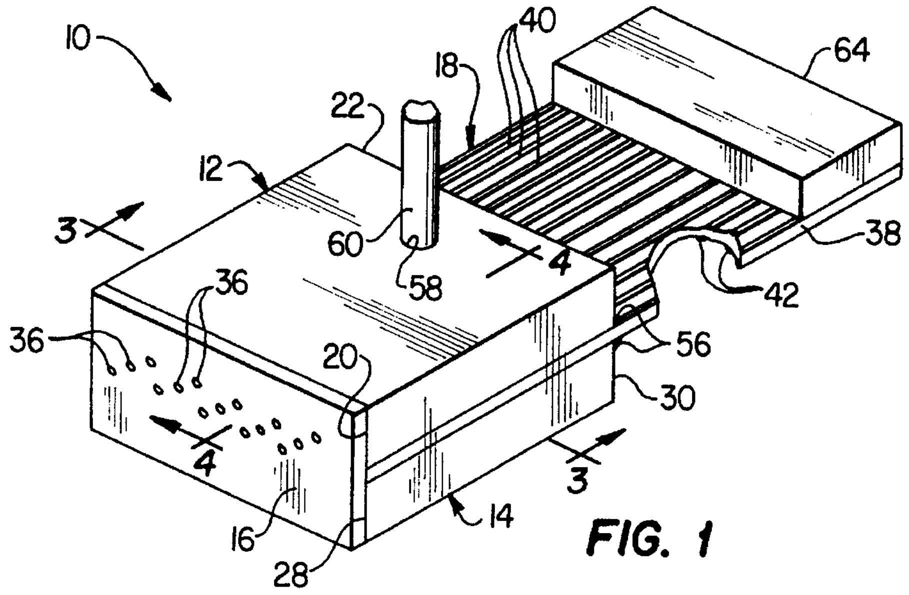
FIG. 1 is a simplified perspective view of a piezoelectric ink jet printhead assembly fabricated by a method embodying principles of the present invention, with certain portions of the assembly being shown at an exaggerated scale for purposes of illustrative clarity.
Figure 2:
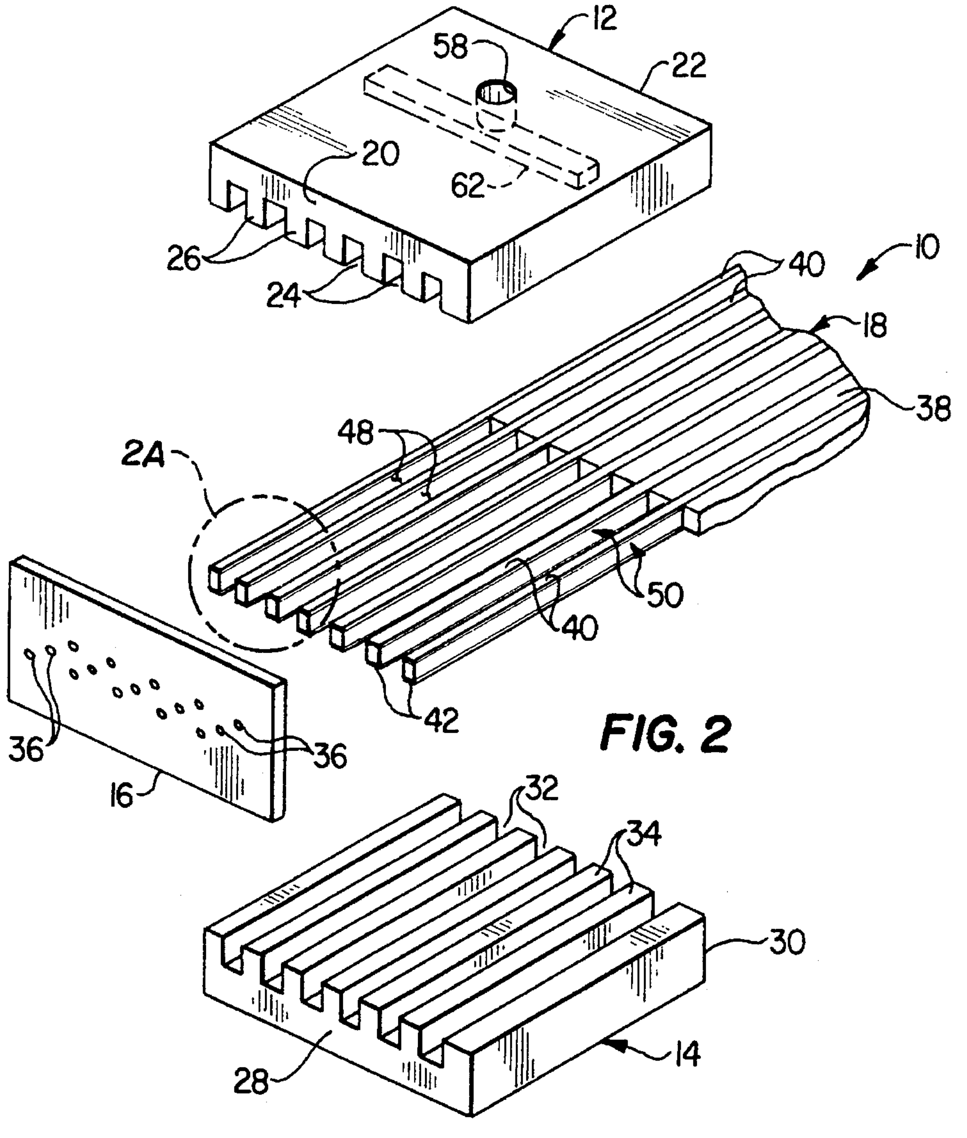
FIG. 2 is an exploded perspective view of the printhead assembly.
Figure 2A:
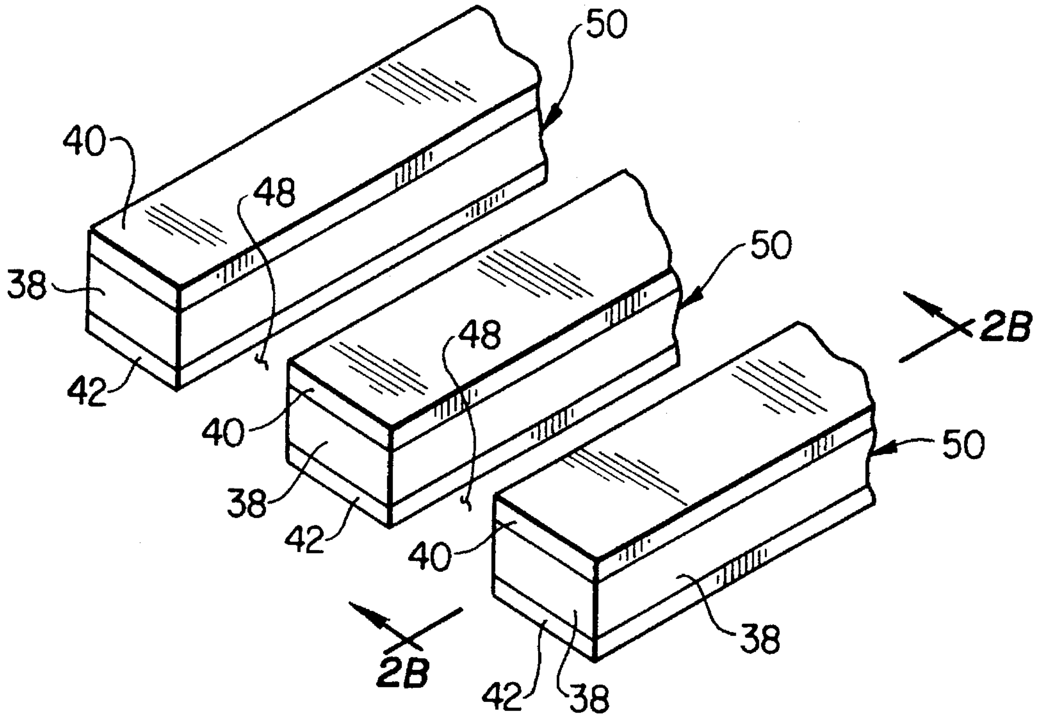
FIG. 2A is an enlarged scale detail view of the circled area "2A" in FIG. 2.

Perspectively illustrated in FIGS. 1 and 2 is an ink jet printhead assembly 10 embodying principles of the present invention. The printhead assembly 10 includes rectangular upper and lower piezoceramic body portions 12 and 14, a rectangular orifice plate 16, and a specially designed driving signal control cable 18.

Piezoelectric upper and lower body portions 12 and 14 are appropriately polled, and are shaped to be placed in precise horizontal alignment with one another as illustrated in FIG. 1. The upper body portion 12 has front and rear end surfaces 20,22 and has formed in its bottom side a mutually spaced series of grooves 24 that longitudinally extend between the front and rear end surfaces 20,22 and define therebetween a spaced series of parallel ribs 26 along the bottom side of the body portion 12. Grooves 24 may be formed in a conventional manner using a precision dicing saw.

The lower body portion 14 has front and rear end surfaces 28,30 and has formed in its top side a mutually spaced series of grooves 32 that longitudinally extend between the front and rear end surfaces 28,30 and define therebetween a spaced series of parallel ribs 34 along the top side of the body portion 14. The widths and lateral spacing of the upper body portion ribs 26 are identical to the widths and lateral spacing of the lower body portion ribs 34. The orifice plate 16 has a horizontally elongated rectangular configuration and has a longitudinally spaced series of small diameter circular ink discharge orifices 36 formed therein.

Figure 2B:
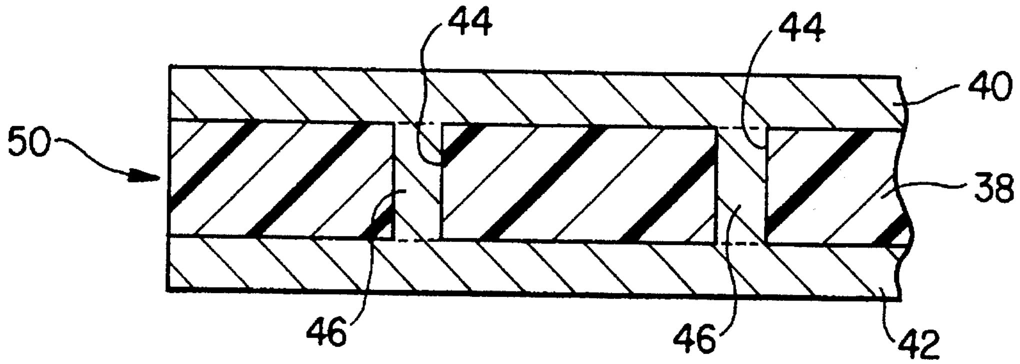
FIG. 2B is an enlarged scale cross-sectional view taken through a driving signal control cable portion of the printhead assembly along line 2B—2B of FIG. 2A.

Referring now to FIGS. 1–2B, the driving signal control cable 18 is representatively a flexible ribbon type conductor cable having an elongated flexible plastic dielectric body portion 38 with laterally spaced series of copper traces 40 and 42 (or traces of another suitable metal material) respectively formed on the top and bottom sides of the body portion 38 and longitudinally extending along its length. Alternatively, the cable body portion 38 could be formed of a relatively rigid dielectric material. The widths of the traces 40 and 42, and their lateral spacing on the opposite sides of the cable body portion 38, are identical to the widths and lateral spacing of the printhead body portion ribs 26 and 34.

For purposes later described, before the traces 40,42 are deposited on the opposite sides of the cable body portion 38, longitudinally spaced series of holes 44 (see FIG. 2B) are formed through the body portion 38 at locations thereon positioned to underlie the traces 40,42. When the copper traces 40,42 are subsequently deposited on the opposite sides of the cable body portion 38 quantities of copper 46 fill the holes 44 and conductively couple horizontally aligned pairs 40,42 of the traces as best illustrated in FIG. 2B.

After the traces 40,42 are formed on the top and bottom sides of the flexible cable body portion 38, a front or left end portion of the cable 18 is modified by appropriately cutting out portions 48 of the cable body 38 disposed between horizontally aligned trace pairs 40,42. This forms along the front end portion of the cable 18 a horizontally spaced series of cable finger portions 50 each having a remaining front end portion of the cable body 32 disposed between a horizontally aligned trace pair 40,42. The length of the fingers 50 is generally equal to or slightly greater than the equal front-to-rear lengths of the upper and lower printhead body portions 12 and 14.

Figure 3:
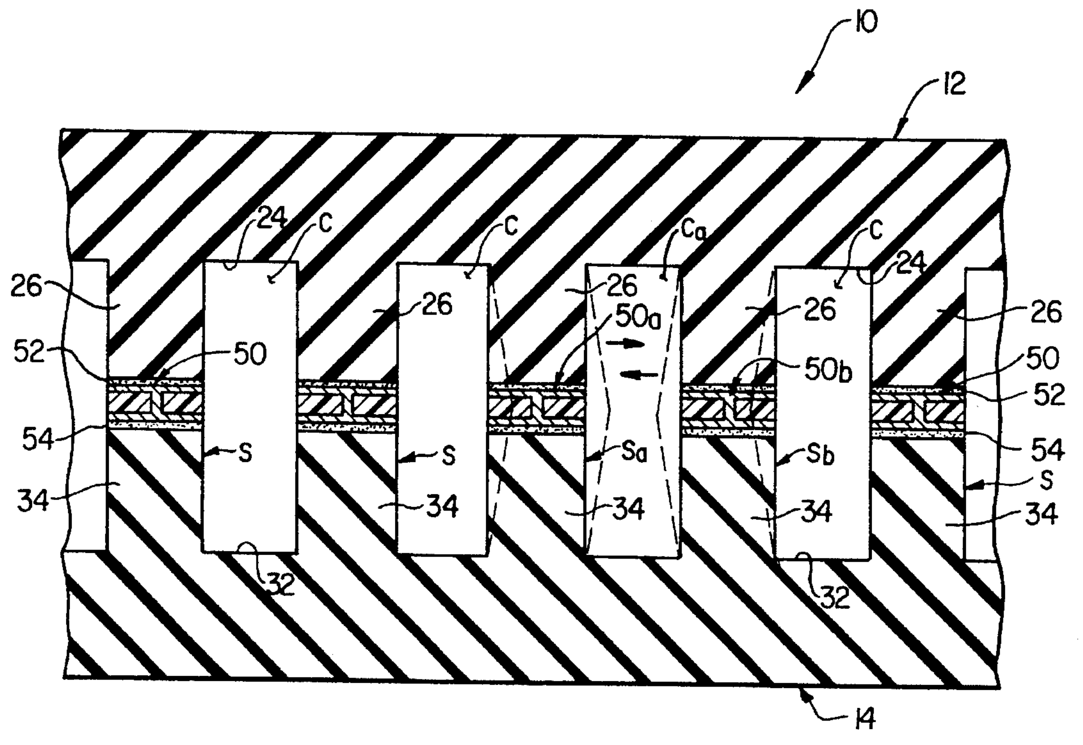
FIG. 3 is an enlarged scale partial cross-sectional view through the printhead assembly taken along line 3—3 of FIG. 1.
Figure 4:
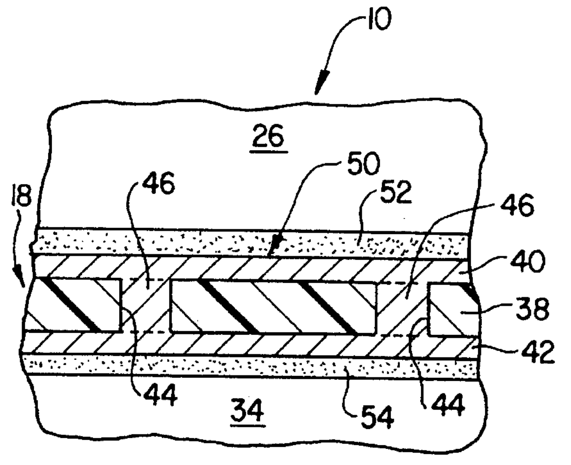
FIG. 4 is an enlarged scale partial cross-sectional view through the printhead assembly taken along line 4—4 of FIG. 1.

In assembling the ink jet printhead 10, the upper and lower printhead body sections 12,14 are aligned with one another, with the open sides of their grooves 24,32 facing one another, and the cable fingers 50 are placed between and aligned with the facing sides of the ribs 26,34 and bonded thereto with layers 52,54 of a suitable electrically conductive adhesive material as best shown in FIGS. 3 and 4. This interconnection of facing rib pairs 26,34 forms within the interior of the printhead body a spaced series of sidewall sections S (see FIG. 3) interdigitated with a spaced series of ink receiving channels C, with the sidewall sections S and the channels C longitudinally extending between the opposite front and rear end surfaces of the printhead body.

At this stage in the fabrication of the printhead 10 the channels C open outwardly through both the front and rear ends of the printhead body. As illustrated in FIG. 1, the securement of the orifice plate 16 to the front end of the printhead body covers the open front ends of the channels C, with each of the orifices 36 being aligned with and forming an ink discharge outlet for one of the channels. The open rear ends of the channels C are sealed off, as at 56 with an appropriate sealant such as epoxy material.

As illustrated in FIGS. 1 and 2, to supply ink to the interior channels C a circular opening 58 is extended downwardly through a rear end section of the upper printhead body portion 12 and receives one end of an ink supply conduit 60. The other end of the conduit 60 is connectable to a suitable supply of printing ink (not shown). The lower end of the opening 58 communicates with an ink supply header 62 internally formed in the upper printhead body portion 12 and in turn communicating with rear end portions of the interior ink receiving channels C.

To control the discharge of ink from the various interior channels C, via their associated discharge plate orifices 36, a schematically depicted electronic driver chip 64 (see FIG. 1) is operatively mounted on a rear top side portion of the cable 18 and electrically coupled to its top side traces 40, each of which forms an upper side portion of one of the cable fingers 50 secured to and electrically coupling the facing rib pairs 26,34 as best illustrated in FIGS. 3 and 4.

When it is desired to discharge ink, in droplet form, from an orifice 36 associated with one of the channels C (for example the orifice associated with the representative channel $C_a$ in FIG. 3), suitable electrical signals are transmitted from the driver 64 to the internal sidewalls $S_a$ and $S_b$ (which laterally bound the channel $C_a$) via the upper leads 40 of their associated cable fingers 50$_a$,50$_b$. Because the upper trace 40 in each of the cable fingers 50$_a$,50$_b$ is electrically coupled to the finger's bottom trace 42 via the transverse copper portions 46, the electrical driving signals transmitted through the upper traces 40 of the cable fingers 50$_a$,50$_b$ are conductively coupled to both the rib portions 26,34 of each of the internal sidewalls $S_a$,$S_b$ via the conductive adhesive layers 52,54.

The generation of these driving signals piezoelectrically causes the sidewalls $S_a$,$S_b$ to inwardly deflect into the channel $C_a$ which they laterally bound, as indicated by the dotted line sidewall positions shown in FIG. 3, and then return to their normal solid line undeflected positions upon cessation of the driving signals. The temporary inward deflection of the internal sidewalls $S_a$,$S_b$ into the channel $C_a$ increases the pressure of the ink therein sufficiently to cause the ink to be discharged in droplet form from the discharge orifice 36 associated with the channel $C_a$.

The fabrication technique just described provides the resulting piezoelectric ink jet printhead 10 with several advantages compared to piezoelectric ink jet printheads of conventional construction. For example, the construction of the cable 18, and the copper-filled openings 44 therein that electrically couple the upper and lower cable traces 40 and 42, advantageously eliminate the need for metallizing the facing side surfaces of the upper and lower piezoelectric printhead body portions 12 and 14. Additionally, since the lower printhead body portion 30 does not extend rearwardly beyond the rear end 22 of the upper printhead body portion 12, there are no exposed piezoceramic ribs which are subject to breakage and corresponding electrical circuitry disruption in the printhead. Further, since the cable 18 is provided with conductive traces on both of its opposite sides, and the traces on either side of the cable are electrically coupled to the traces on the other side of the cable, considerably more trace "real estate" is provided in the printhead 10 than in printheads of conventional construction in which the metallized side surfaces of exposed piezoceramic rib portions are used, in effect, as driving signal traces.

Figure 4A:
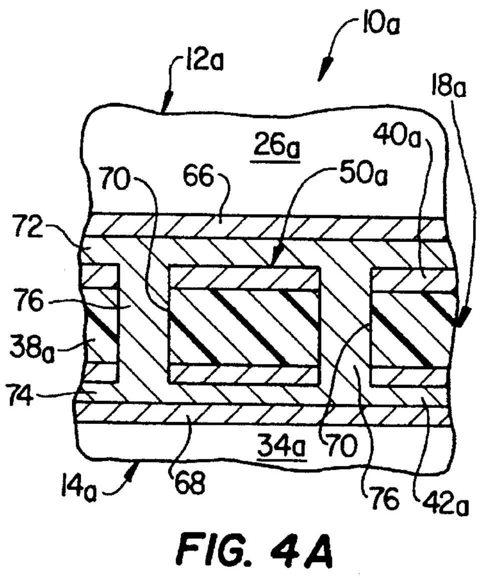
FIG. 4A is an enlarged scale partial cross-sectional view, similar to FIG. 4, taken through a first alternate embodiment of the printhead assembly.

A portion of an alternate embodiment **10*a* of the ink jet printhead 10 is cross-sectionally illustrated in FIG. 4A, with components of the printhead 10*a* similar to those in printhead 10 being given identical references, but with the subscripts "a" for ease in comparison to their counterparts in printhead 10. During the initial fabrication of the upper and lower piezoceramic body portions 12*a*,14*a* of the printhead 10*a*, metallized coatings 66,68 are respectively deposited on the bottom and top sides of the body portions 12a,14a. Grooves similar to the previously described grooves 24,32 are then cut into the body portions 12a,14a to from the ribs 26a,34**a shown in FIG. 4A.

In constructing the cable 18a, the upper and lower side copper side traces 40a,42a are not initially coupled to one another as described in conjunction with the cable 18 shown in FIG. 4. Instead, after the traces 40a,42a are deposited on the top and bottom sides of the cable body 38a, transverse holes 70 are formed through the cable finger portions 50a prior to the insertion of the finger portions 50a between the aligned sets of ribs 26a,34a. To conductively secure the cable fingers 50a in place between the metallized surfaces 66,68 of the ribs 26a,34a a solder reflow process is used position layers of solder 72,74 between the metallized layers 66,68 and the cable finger traces 40a,42a as illustrated in FIG. 4A. The solder layers 72,74 are conductively coupled to one another by vertical solder columns 76 formed during the reflow process and disposed within the transverse cable finger openings 70.

Figure 5A:
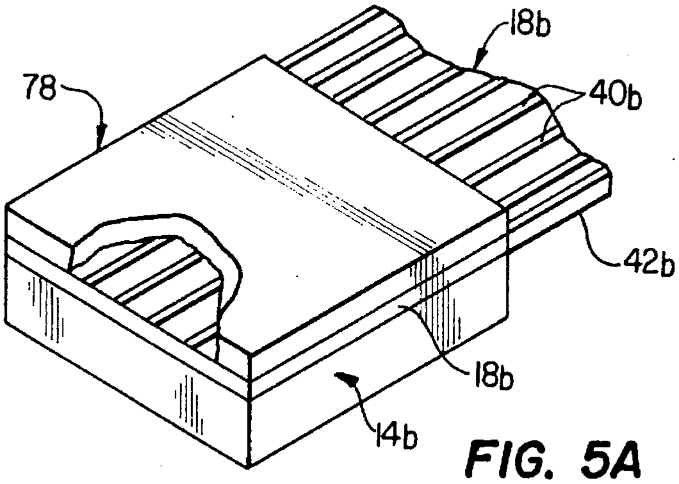
FIGS. 5A–5C are perspective views of a second alternate embodiment of the printhead assembly sequentially illustrating its fabrication.
Figure 5B:
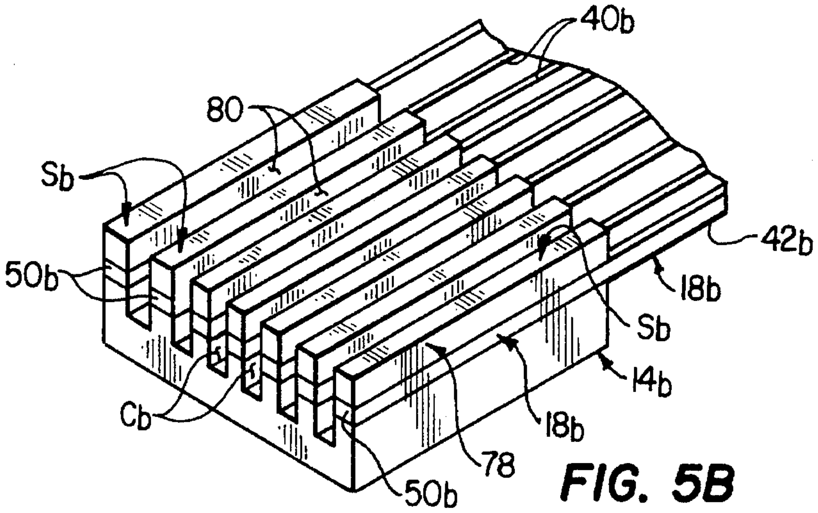
Figure 5C:
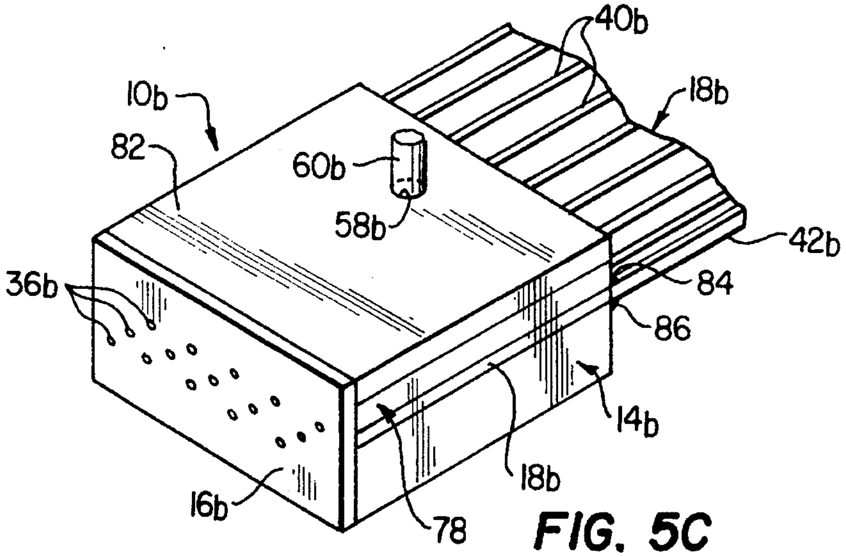

A second alternate embodiment 10b of the previously described ink jet printhead 10 is illustrated in FIG. 5C, and FIGS. 5A–5C sequentially illustrate the manner in which the printhead 10b is fabricated. Components in the printhead 10b similar to those in printhead 10 have been given identical reference numerals but with the subscripts "b" for ease in comparison to their counterparts in printhead 10.

Referring initially to FIG. 5A, in the initial fabrication of the printhead 10b a front end portion of the cable 18b is sandwiched between a lower piezoceramic body block 14b and a somewhat thinner, ungrooved intermediate piezoceramic body block 78, and bonded to its facing side surfaces using an appropriate electrically conductive adhesive material. The cable 18b differs from the previously described cable 18 in that in the cable 18b the front end cutout areas between the vertical opposite trace pairs 40b,42b are not formed in the cable 18b before it is inserted between the printhead body portions 14b and 78. Instead, as illustrated in FIG. 5B, the cable fingers 50b are subsequently formed by cutting a horizontally spaced series of grooves 80 into the top side of the body portion 78.

Grooves 80 longitudinally extend between the aligned front and rear ends of the body portions 14b and 78, laterally extend downwardly through the cable 18b to form the finger portions 50b thereof, and into the top side of the lower body portion 14b. As illustrated in FIG. 5B, the grooves 80 define therein the sidewall sections $S_b$ that laterally bound the ink receiving channels $C^b$.

Referring now to FIG. 5C, to complete the fabrication of the ink jet printhead assembly 10b, a relatively thin rectangular top body portion 82 is bonded to the top side of the body portion 78 to cover the open top sides of the channels $C_b$; an orifice plate 16b is secured to the aligned front ends of the body portions 14b,78 and 82 over the open front ends of the channels $C_b$; the open rear ends of the channels $C_b$ are sealed off as at 84 and 86; and one end of an ink supply conduit 60b is secured within the circular opening 58b in the upper printhead body portion 58b.

The foregoing detailed description is to be clearly understood as being given by way of illustration and example only, the spirit and scope of the present invention being limited solely by the appended claims.

What is claimed is:

1. A method of fabricating a piezoelectric ink jet printhead, said method comprising the steps of:

forming first and second printhead body structures having sides thereon in which spaced series of parallel grooves define spaced series of parallel ribs having outer side surfaces;

providing a generally flat driving signal control cable having,a dielectric body portion with opposite first and second sides along which laterally spaced series of parallel, electrically conductive first and second traces extend in lateral alignment with one another, and through which piezoelectric driving signals may be electrically transmitted;

removing portions of said dielectric control cable body portion between opposed pairs of first and second traces on a first end portion of said control cable to form laterally spaced finger portions each having portions of said first and second traces on opposite side portions thereof;

positioning said outer side surfaces of said ribs on said first printhead body structure in an aligned, facing relationship with said outer side surfaces of said ribs on said second printhead body structure;

positioning said finger portions of said control cable between and in alignment with the opposing pairs of outer rib side surfaces, with the first and second trace portions on said finger portions facing the opposing pairs of outer rib side surfaces, and a second end portion of said control cable projecting outwardly from said first and second printhead body structures; and conductively securing the first and second trace portions on said finger portions to the opposing pairs of outer rib side surfaces.

2. The method of claim 1 wherein:

said first and second traces are of a metal material, the first and second traces in each opposing pair thereof are electrically coupled to one another by spaced portions of said metal material extending transversely through said dielectric body portion of said control cable, and said conductively securing step is performed using an electrically conductive adhesive material.

3. The method of claim 1 wherein:

said outer side surfaces of said ribs have metallized coating layers thereon, said finger portions of said control cable have longitudinally spaced series of openings extending therethrough between the outer side surfaces of the first and second trace portions thereon, and said conductively securing step is performed using a solder material disposed between the first and second trace portions on said finger portions and said metallized coating layers and extending through said series of openings to thereby electrically couple the first and second trace portions disposed on each of said finger portions of said control cable.

4. The method of claim 1 further comprising the step of:

mounting an electronic driver chip on said second end portion of said control cable, said chip being operable to electrically transmit piezoelectric driving signals through at least some of said first and second traces.

5. The method of claim 1 wherein:

said first and second printhead body structures have aligned front and rear end surfaces, and said method further comprises the step of operatively securing an orifice discharge plate to said aligned front end surfaces.

6. The method of claim 1 wherein:

said step of removing portions of said dielectric control cable body portion is performed before said finger portions are conductively secured to the opposing pairs of outer rib side surfaces.

7. The method of claim 1 wherein:

said step of removing portions of said dielectric control cable body portion is performed after said first end portion of said control cable is secured to said first and second printhead body sections and before said grooves are formed in said first and second printhead body sections.

8. The method of claim 7 wherein:

said step of removing portions of said dielectric control cable body portion is effected by the formation of said grooves in said first and second printhead body sections.

* * * * *